United States Patent [19]
Yoon et al.

[11] Patent Number: 5,953,259
[45] Date of Patent: Sep. 14, 1999

[54] INTEGRATED CIRCUIT MEMORY DEVICES HAVING CROSS-COUPLED ISOLATION GATE CONTROLLERS WHICH PROVIDE SIMULTANEOUS READING AND WRITING CAPABILITY TO MULTIPLE MEMORY ARRAYS

[75] Inventors: Sei-seung Yoon, Seoul; Gi-hong Kim, Kyungki-do, both of Rep. of Korea

[73] Assignee: Samsung Electronics Co., Ltd., Rep. of Korea

[21] Appl. No.: 09/103,985

[22] Filed: Jun. 24, 1998

[30] Foreign Application Priority Data

Dec. 8, 1997 [KR] Rep. of Korea .................. 97-66749

[51] Int. Cl.[6] .................................................. G11C 16/04
[52] U.S. Cl. ...................... 365/189.04; 365/205; 365/220
[58] Field of Search ............................... 365/189.04, 205, 365/220

[56] References Cited

U.S. PATENT DOCUMENTS

| | | | |
|---|---|---|---|
| 4,736,343 | 4/1988 | Hidaka et al. | 365/203 |
| 5,274,585 | 12/1993 | Suyama et al. | 365/149 |
| 5,701,268 | 12/1997 | Lee et al. | 365/205 |
| 5,726,939 | 3/1998 | Cho et al. | 365/201 |

*Primary Examiner*—David C. Nelms
*Assistant Examiner*—Tuan T. Nguyen
*Attorney, Agent, or Firm*—Myers Bigel Sibley & Sajovec

[57] ABSTRACT

Preferred integrated circuit memory devices have the capability of connecting a sense amplifier to multiple arrays of memory one-at-a-time or simultaneously, in response to first and second control signals, respectively. These memory devices include first and second memory arrays which have first and second pairs of differential input/output lines electrically coupled thereto, respectively. A sense amplifier is also provided having first and second pairs of differential input/output lines. To provide independent or simultaneous access to the first and second memory arrays by the sense amplifier, preferred isolation and equalization circuits are provided. With these circuits, a first electrical connection can be formed between the first pairs of differential input/output lines of the first memory array and the sense amplifier and a second electrical connection can be simultaneously formed between the second pairs of differential input/outlput lines of the second memory array and the sense amplifier, when a control signal line is in a first logic state (e.g., logic 0). These preferred isolation and equalization circuits also preclude simultaneous formation of the first and second electrical connections when the control signal line is in a second logic state (e.g., logic 1).

14 Claims, 3 Drawing Sheets

INTEGRATED CIRCUIT MEMORY DEVICES HAVING CROSS-COUPLED ISOLATION GATE CONTROLLERS WHICH PROVIDE SIMULTANEOUS READING AND WRITING CAPABILITY TO MULTIPLE MEMORY ARRAYS

FIELD OF THE INVENTION

The present invention relates to integrated circuit memory devices and methods of operating and testing same.

BACKGROUND OF THE INVENTION

Many integrated circuit memory devices include sense amplifiers to facilitate writing and reading of data to and from an array of memory devices therein. As will be understood by those skilled in the art, sense amplifiers typically perform a function of sensing a relatively small differential input signal across a pair of differential input lines and then amplifying the small differential input signal by driving a pair of differential output lines rail-to-rail (e.g., Vdd-to-GND) with a differential output signal. An exemplary sense amplifier is disclosed in U.S. Pat. No. 5,701,268 to Lee et al., entitled "Sense Amplifier for Integrated Circuit Memory Devices Having Boosted Sense and Current Drive Capability and Methods of Operating Same", assigned to the present assignee, the disclosure of which is hereby incorporated herein by reference.

Referring now to FIG. 1, an electrical schematic of an integrated circuit memory device according to the prior art will be described. In this prior art memory device, a plurality of separate memory cell arrays 101 and 102 can be electrically coupled one-at-a-time to a single sense amplifier 111. Access to the first memory cell array 101 is provided by a first plurality of pairs of differential input/output lines. This first plurality of pairs of differential input/output lines may be a first plurality of pairs of complementary bit lines (BL1, BLB1, . . . , Bln, BLBn, where n is an odd integer). As illustrated, a first pair of complementary bit lines BL1 and BLB1 may be used to write data to or read data from a plurality of memory cells in the first memory cell array 101. A first equalization circuit 121 and a first isolation gate 131 are electrically coupled between the first memory cell array 101 and the sense amplifier 111. A first equalization circuit controller 141 and first isolation gate controller 151 are also provided. The first isolation gate 131 is responsive to a logic 1 signal on a first isolation signal line PISOi, and the first equalization circuit 121 and the first equalization circuit controller 141 are responsive to signals on a pair of first equalization signal lines PEQi and PEQiB.

As illustrated, the first equalization circuit 121 comprises a plurality of NMOS transistors and the first equalization circuit controller 141 is configured as an NMOS pull-down transistor. Based on this configuration, if the first equalization signal line PEQi is set to a logic 1 potential, the complementary first equalization signal line PEQiB will be pulled to a logic 0 potential to turn-off the NMOS transistors in the first equalization circuit 121. However, if the first equalization signal line PEQi is set to a logic 0 potential, the complementary first equalization signal line PEQiB may be held at a logic 1 potential so that the NMOS transistors in the first equalization circuit may be turned-on to thereby electrically short the complementary bit lines together. In this latter case, the first pair of complementary bit lines BL1 and BLB1 may be set to an equalized and precharged potential of ½Vdd, prior to or after a reading or writing operation is performed. As will be understood by those skilled in the art, after the first pair of complementary bit lines BL1 and BLB1 have been set to an equalized precharged potential (e.g., ½Vdd), a reading or writing operation may be performed by driving both the first equalization signal line PEQi and the first isolation signal line PISOi to a logic 1 potential so that the first pair of complementary bit lines BL1 and BLB1 become electrically connected via the first isolation gate 131 to a first pair of input/output lines at the sense amplifier 111. Driving the first equalization signal line PEQi to a logic 1 potential will turn on the NMOS pull-down transistor in the first equalization circuit controller 141 and pull-down the complementary first equalization signal line PEQiB so that the first equalization circuit 121 is turned off.

Similarly, access to the second memory cell array 102 is provided by a second plurality of pairs of differential input/output lines. This second plurality of pairs of differential input/output lines may be a second plurality of pairs of complementary bit lines (BL2, BLB2, . . . , Bln+1, BLBn+1, where n is an odd integer). As illustrated, a second pair of complementary bit lines BL2 and BLB2 may be used to write data to or read data from the second memory cell array 102. A second equalization circuit 122 and a second isolation gate 132 are electrically coupled between the second memory cell array 102 and the sense amplifier 111. A second equalization circuit controller 142 and a second isolation gate controller 152 are also provided. The second isolation gate 132 is responsive to a logic 1 signal on a second isolation signal line PISOj and the second equalization circuit 122 and second equalization circuit controller 142 are responsive to signals on a pair of second equalization signal lines PEQj and PEQjB.

The second equalization circuit 122 comprises a plurality of NMOS transistors and the second equalization circuit controller 142 is configured as an NMOS pull-down transistor. Based on this configuration, if the second equalization signal line PEQj is set to a logic 1 potential, the complementary second equalization signal line PEQjB will be pulled to a logic 0 potential to turn-off the NMOS transistors in the second equalization circuit 122. However, if the second equalization signal line PEQJ is set to a logic 0 potential, the complementary second equalization signal line PEQjB may be held at a logic 1 potential so that the NMOS transistors in the second equalization circuit may be turned-on. In this latter case, the second pair of complementary bit lines BL2 and BLB2 may be set to an equalized and precharged potential of ½Vdd, prior to or after a reading or writing operation. As will be understood by those skilled in the art, after the second pair of complementary bit lines BL2 and BLB2 have been set to an equalized precharged potential (e.g., ½Vdd), a reading or writing operation may be performed by driving both the second equalization signal line PEQj and the second isolation signal line PISOj to a logic 1 potential so that the second pair of complementary bit lines BL2 and BLB2 become electrically connected via the second isolation gate 132 to a second pair of input/output lines at the sense amplifier 111.

Unfortunately, the cross-coupled electrical connections between the first isolation gate controller 151 and the second equalization circuit controller 142 and between the second isolation gate controller 152 and the first equalization circuit controller 141 preclude the simultaneous formation of electrical connections between the sense amplifier 111 and the first and second memory cell arrays 101 and 102. For example, if the sense amplifier 111 is electrically coupled to the first memory cell array 101 by driving the first equalization signal line PEQi and the first isolation signal line PISOi to logic 1 potentials, then the second isolation signal line PISOj will be pull-down to a logic 0 potential by operation of the second isolation gate controller 152 which has its control input (e.g., gate electrode) electrically connected to the first equalization signal line PEQi. Alternatively, if the sense amplifier 111 is electrically coupled to the second memory cell array 102 by driving the second equalization signal line PEQj and the second isolation signal line PISOj to logic 1 potentials, then the first isolation signal line PISOi will be pull-down to a logic 0 potential by operation of the first isolation gate controller 151 which has its control input (e.g., gate electrode) electrically connected to the second equalization signal line PEQj. Thus, the prior art memory device of FIG. 1 does not allow the sense amplifier 111 to be simultaneously connected to both the first and second memory cell arrays 101 and 102 to enable simultaneous reading from these arrays when performing burn-in stress testing and other operations.

SUMMARY OF THE INVENTION

It is therefore an object of the present invention to provide improved integrated circuit memory devices.

It is another object of the present invention to provide integrated circuit memory devices which have the capability of writing data to multiple arrays of memory one-at-a-time or simultaneously and reading data from multiple arrays of memory one-at-a-time or simultaneously.

These and other objects, features and advantages of the present invention are provided by integrated circuit memory devices which have the capability of connecting a sense amplifier to multiple arrays of memory one-at-a-time or simultaneously, in response to first and second control signals, respectively. According to an embodiment of the present invention, first and second memory arrays are provided which have first and second pairs of differential input/output lines electrically coupled thereto, respectively. A sense amplifier is also provided having first and second pairs of differential input/output lines. To provide independent or simultaneous access to the first and second memory arrays by the sense amplifier, preferred isolation and equalization circuits are provided. With these circuits, a first electrical connection can be formed between the first pairs of differential input/output lines of the first memory array and the sense amplifier and a second electrical connection can be simultaneously formed between the second pairs of differential input/output lines of the second memory array and the sense amplifier, when a control signal line is in a first logic state (e.g., logic 0). These preferred isolation and equalization circuits also preclude simultaneous formation of the first and second electrical connections when the control signal line is in a second logic state (e.g., logic 1).

In particular, the preferred isolation and equalization circuits include a first equalization device electrically coupled to the first pair of differential input/output lines of the first memory array and a second equalization device electrically coupled to the second pair of differential input/output lines of the second memory array. First and second equalization controllers are also provided. The first equalization controller is electrically coupled to the first equalization device and the second equalization controller is electrically coupled to the second equalization device. In addition, first and second isolation gates and first and second isolation gate controllers are provided. The first isolation gate is electrically coupled between the first equalization device and the first pair of differential input/output lines of the sense amplifier and the second isolation gate is electrically coupled between the second equalization device and the second pair of differential input/output lines of the sense amplifier. The first isolation gate controller has an output electrically coupled to a control input of the first isolation gate and has first and second inputs electrically cross-coupled to the second equalization controller and coupled to the control signal line, respectively. The second isolation gate controller has an output electrically coupled to a control input of the second isolation gate and has first and second inputs electrically cross-coupled to the first equalization controller and coupled to the control signal line, respectively.

Here, the first and second isolation gate controllers preferably comprise first and second pull-up/down transistor pairs, respectively, and one transistor in each of the pull-up/down transistor pairs has a gate electrode which is coupled to the control signal line. According to a preferred aspect of the present invention, each pull-up/down transistor pair comprises a pair of MOS transistors (e.g., NMOS or PMOS) which are electrically connected in series between a respective isolation gate and either a power supply line (Vdd) or ground line (GND). Thus, both series connected transistors in the first pair must be simultaneously turned on to connect the control input of the first isolation gate to Vdd or GND. Similarly, both series connected transistors in the second pair must be simultaneously turned on to connect (e.g., "short") the control input of the second isolation gate to Vdd or GND. Using this configuration, the control signal line can be used to selectively control whether the sense amplifier is connected to only one memory array or whether the sense amplifier can be simultaneously connected to multiple memory arrays.

DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 2:
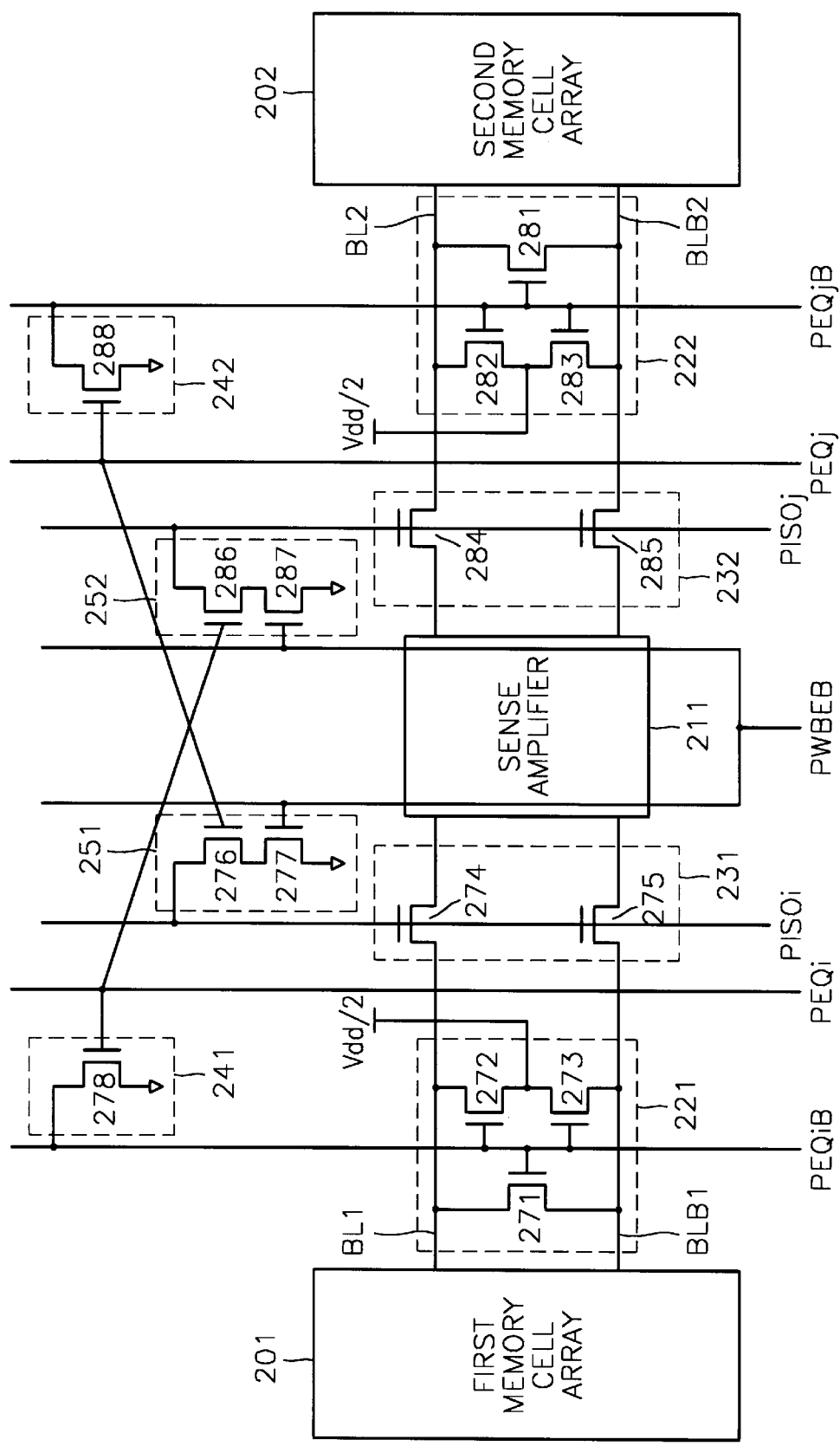
FIG. 2 is an electrical schematic of an integrated circuit memory device according to an embodiment of the present invention.

Referring now to FIG. 2, an integrated circuit memory device according to a preferred embodiment of the present invention will be described. This integrated circuit memory device has the capability of connecting a sense amplifier 211 to multiple arrays of memory 201–202 one-at-a-time or simultaneously, in response to first and second control signals, respectively, which are provided by a control signal line PWBEB. Here, the first array of memory 201 has a first plurality of differential input/output lines coupled thereto. As illustrated, this first plurality of differential input/output lines includes a first pair of differential bit lines BL1 and BLB1. The second array of memory 202 has a second plurality of differential input/output lines coupled thereto.

As illustrated, this second plurality of differential input/output lines includes a second pair of differential bit lines BL2 and BLB2. The sense amplifier 211 may also be provided with first and second pluralities of pairs of differential input/output lines which can be electrically coupled to the first plurality of differential input/output lines at the first array of memory 201 and to the second plurality of differential input/output lines at the second array of memory 202. The construction and operation of this sense amplifier 211 may be as described in the aforementioned U.S. Pat. No. 5,701,268 to Lee et al. To provide independent or simultaneous access to the first and second memory arrays 201–202 by the sense amplifier 211, preferred isolation and equalization circuits are provided. With these circuits, a first electrical connection can be formed between the first pairs of differential input/output lines (e.g., BL1 and BLB1) of the first memory array 201 and the sense amplifier 211 and a second electrical connection can be simultaneously formed between the second pairs of differential input/output lines (e.g., BL2 and BLB2) of the second memory array 202 and the sense amplifier 211, when a control signal line PWBEB is in a first logic state (e.g., logic 0). These preferred isolation and equalization circuits also preclude simultaneous formation of the first and second electrical connections when the control signal line PWBEB is in a second logic state (e.g., logic 1).

In particular, the preferred isolation and equalization circuits include a first equalization device 221 electrically coupled across the first pair of differential input/output lines BL1 and BLB1 of the first memory array 201 and a second equalization device 222 electrically coupled across the second pair of differential input/output lines BL2 and BLB2 of the second memory array 202. First and second equalization controllers 241–242 are also provided. The first equalization controller 241 is electrically coupled to the first equalization device 221 and the second equalization controller 242 is electrically coupled to the second equalization device 222. In addition, first and second isolation gates 231–232 and first and second isolation gate controllers 251–252 are provided. The first isolation gate 231 is electrically coupled between the first equalization device 221 and the first pair of differential input/output lines of the sense amplifier 211 and the second isolation gate 232 is electrically coupled between the second equalization device 222 and the second pair of differential input/output lines of the sense amplifier 211. The first isolation gate controller 251 has an output electrically coupled to a control input of the first isolation gate 231 (by a first isolation signal line PISOi) and has first and second inputs electrically coupled to the second equalization controller 242 and the control signal line PWBEB, respectively. The second isolation gate controller 252 has an output electrically coupled to a control input of the second isolation gate 232 (by a second isolation signal line PISOj) and has first and second inputs electrically coupled to the first equalization controller 241 and the control signal line PWBEB, respectively.

Here, the first and second isolation gate controllers 251–252 preferably comprise first and second pull-up/down transistor pairs, respectively. One transistor in each of the pull-up/down transistor pairs has a gate electrode which is coupled to the control signal line PWBEB and the other transistor in each pair has a gate electrode which is cross-coupled to the input of the first or second equalization controllers 241–242. According to a preferred aspect of the present invention, each pull-up/down transistor pair comprises a pair of MOS transistors (e.g., NMOS or PMOS) which are electrically connected in series between a respective isolation gate (via a respective isolation signal line PISOi or PISOj) and either a ground line (GND), as illustrated, or a power supply line (Vdd) (not shown). In particular, in the event the equalization devices 221–222, isolation gates 231–232 and equalization controllers 241–242 comprise NMOS transistors, as illustrated, the pair of MOS transistors in each pull-up/down transistor pair preferably comprise first and second NMOS transistors which are connected in series between a respective isolation gate and a ground line (GND). However, in the event the equalization devices 221–222, isolation gates 231–232 and equalization controllers 241–242 comprise PMOS transistors (not shown), the pair of MOS transistors in each pull-up/down transistor pair preferably comprise first and second PMOS transistors which are connected in series between a respective isolation gate and a power supply line (Vdd). Thus, both series connected transistors in the first isolation gate controller 251 must be simultaneously turned on to connect the first isolation signal line PISOi to GND or (Vdd). Similarly, both series connected transistors in the second isolation gate controller 252 must be simultaneously turned on to connect the second isolation signal line PISOi to Vdd or GND. Based on this preferred configuration of the first and second isolation gate controllers 251–252, the control signal line PWBEB can be used to selectively control whether the sense amplifier 211 is connected to only one memory array or whether the sense amplifier 211 can be simultaneously connected to multiple memory arrays simultaneously.

Figure 1:
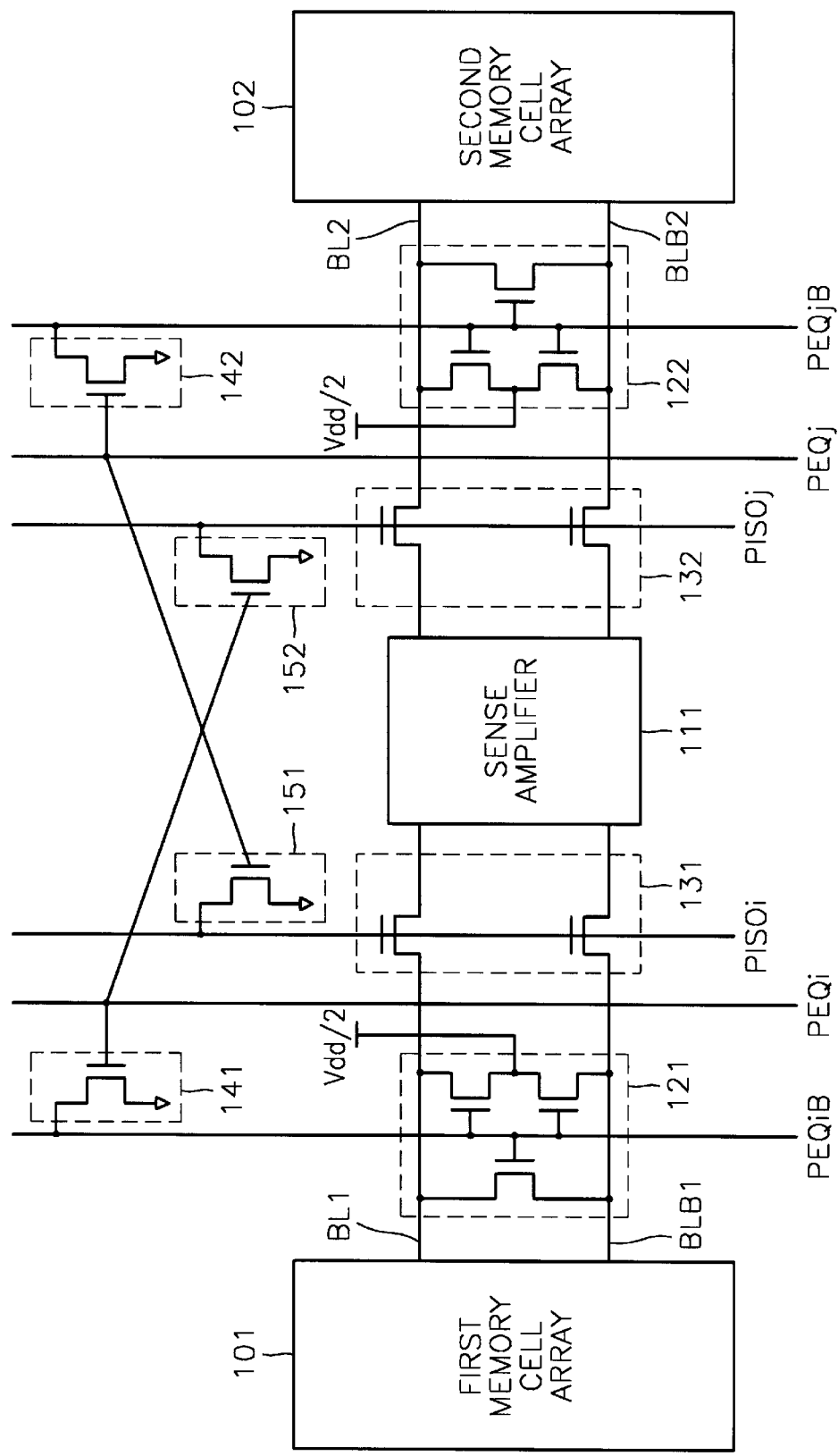
FIG. 1 is an electrical schematic of an integrated circuit memory device according to the prior art.

Referring still to FIG. 2, the operation of a preferred embodiment of the first and second equalization devices 221–222, first and second isolation gates 231–232, first and second equalization controllers 241–242 and first and second isolation gate controllers 251–252, will now be described in greater detail. With respect to the circuits on the left side of FIG. 2, the first equalization device 221 contains a plurality of NMOS transistors 271–273 which have gate electrodes commonly connected to one of the first pair of differential equalization signal lines PEQi and PEQiB (which preferably receive complementary logic signals). Based on the illustrated interconnection of the NMOS transistors 271–273, application of a logic 1 potential to signal line PEQiB will cause bit line BL1 to become shorted to bit line BLB1 by NMOS transistor 271 and cause equalization of these differential bit lines at a precharged potential of ½ Vdd by NMOS transistors 272–273. Application of a logic 1 potential to the first isolation signal line PISOi (preferably while the signal line PEQiB is at a logic 1 potential) will also cause the NMOS pass transistors 274 and 275 to turn on so that the first pair of input/output lines at the sense amplifier 211 may also be precharged at ½Vdd. Then, application of a logic 1 potential to signal line PEQi will cause the NMOS transistor 278 in the first equalization controller 241 to turn on. When the NMOS transistor 278 turns on, the signal line PEQi will be pulled to a logic 0 potential (e.g., GND) and thereby turn off the NMOS transistors 271–273 in the first equalization device 221. By turning off the NMOS transistors 271–273 in the first equalization device 221, the bit line BL1 becomes electrically disconnected from the bit line BLB1. The logic state of a particular memory cell coupled to the first pair of bit lines BL1 and BLB1 can then be sensed by the sense amplifier 211 during a read operation, using techniques well known to those skilled in the art. The application of a logic 1 potential to signal line PEQi will also cause the NMOS transistor 286 in the second isolation gate controller 252 to turn on. If the control signal line PWBEB is at a logic 1 potential (to turn on NMOS transistor 287 in the second isolation gate controller), then application of a logic 1 potential to signal line PEQi (to turn off the first equalization device 221) will also pull down the second isolation signal line PISOJ to a logic 0 potential and thereby prevent both the first and second isolation gates 231 and 232 from being simultaneously turned on. Accordingly, maintaining the control signal line PWBEB at a logic 1 potential will prevent the sense amplifier from being simultaneously connected to the first and second arrays of memory 201–202. However, if the control signal line PWBEB is set to a logic 0 potential, the second isolation signal line PISOj will not be pulled down to a logic 0 potential when signal line PEQi is driven to a logic 1 potential by an external circuit (not shown). Accordingly, maintaining the control signal line PWBEB at a logic 0 potential will enable simultaneous communication between the sense amplifier 211 and the first and second arrays of memory 201–202, unlike the prior art device of FIG. 1.

Similarly, with respect to the circuits on the right side of FIG. 2, the second equalization device 222 contains a plurality of NMOS transistors 281–283 which have gate electrodes commonly connected to one of the second pair of differential equalization signal lines PEQj and PEQjB (which preferably receive complementary logic signals). Based on the illustrated interconnection of the NMOS transistors 281–283, application of a logic 1 potential to signal line PEQjB will cause bit line BL2 to become shorted to bit line BLB2 by NMOS transistor 281 and equalization of these differential bit lines at a precharged potential of ½ Vdd by NMOS transistors 282–283. Application of a logic 1 potential to the second isolation signal line PISOj (preferably while the signal line PEQjB is at a logic 1 potential) will also cause the NMOS pass transistors 284 and 285 to turn on so that the second pair of input/output lines at the sense amplifier 211 may also be precharged at ½ Vdd. Then, application of a logic 1 potential to signal line PEQj will cause the NMOS transistor 288 in the second equalization controller 242 to turn on. When the NMOS transistor 288 turns on, the signal line PEQj will be pulled to a logic 0 potential (e.g., GND) and thereby turn off the NMOS transistors 281–283 in the second equalization device 222. By turning off the NMOS transistors 281–283 in the second equalization device 222, the bit line BL2 becomes electrically disconnected from the bit line BLB2. The application of a logic 1 potential to signal line PEQj will also cause the NMOS transistor 276 in the first isolation gate controller 251 to turn on. If the control signal line PWBEB is at a logic 1 potential (to turn on NMOS transistor 287 in the second isolation gate controller), the application of a logic 1 potential to signal line PEQj (to turn off the second equalization device 222) will also pull down the first isolation signal line PISOi to a logic 0 potential and thereby prevent both the first and second isolation gates 231 and 232 from being simultaneously turned on. Accordingly, maintaining the control signal line PWBEB at a logic 1 potential will prevent the sense amplifier from being simultaneously connected to the first and second arrays of memory 201–202. However, if the control signal line PWBEB is set to a logic 0 potential, the first isolation signal line PISOi will not be pulled down to a logic 0 potential when signal line PEQj is driven to a logic 1 potential by an external circuit (not shown).

Figure 3:
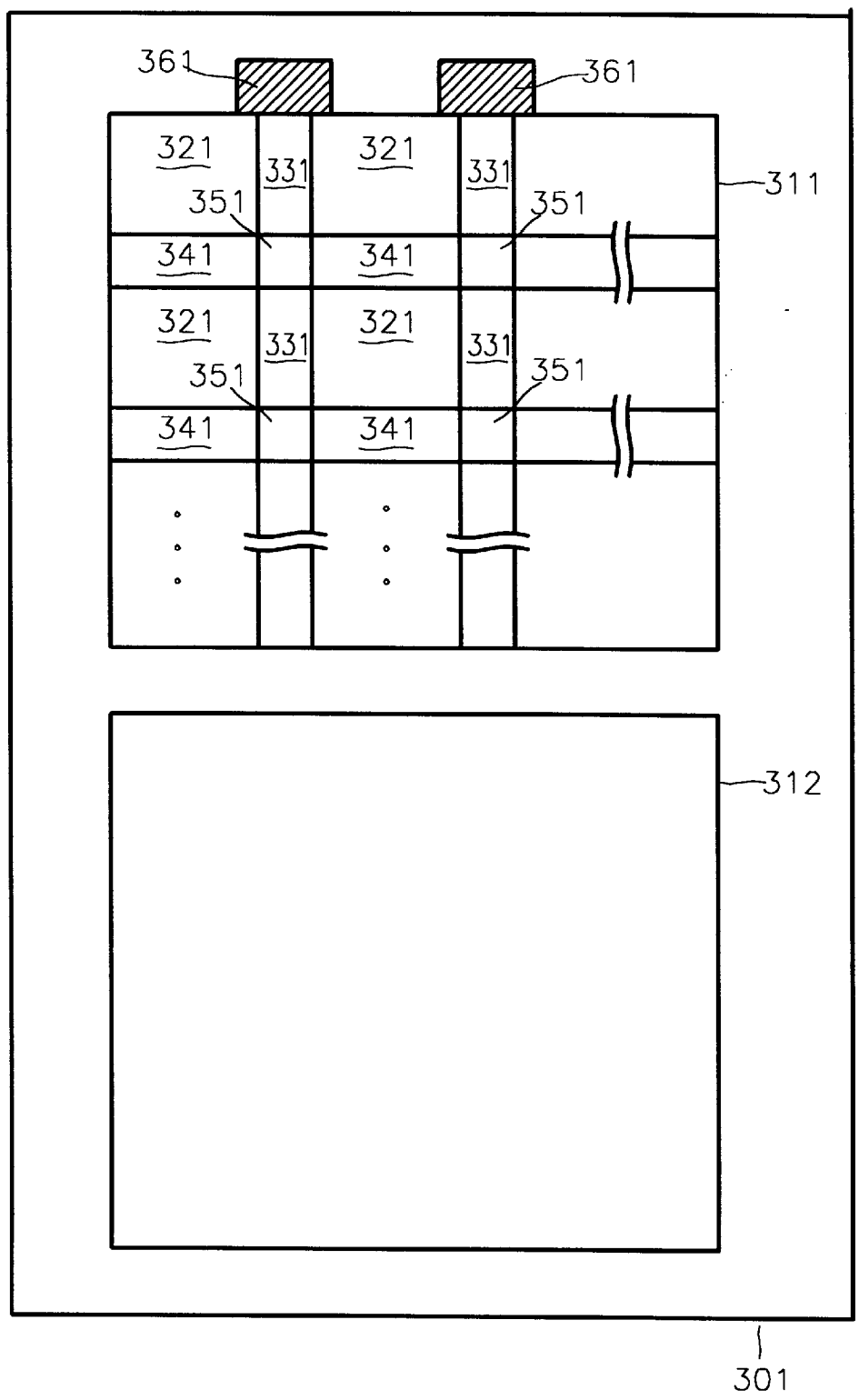
FIG. 3 is a plan view of a preferred layout of the memory device of FIG. 2.

FIG. 3 is a diagram illustrating a preferred circuit layout for the semiconductor memory device of FIG. 2. Referring to FIG. 3, a semiconductor memory device 301 includes memory banks 311 and 312. The memory bank 311 includes an area 321 in which memory cell arrays are arranged, an area 341 in which sub-word line drivers are arranged, an area 331 in which sense amplifiers are arranged, and a conjunction area 351 in which several kinds of drivers are arranged. The first and second isolation gate controllers 251 and 252 shown in FIG. 2 may be arranged in the conjunction area 351 or in a peripheral area 361 of the memory bank 311. The memory bank 312 has the same structure as the memory bank 311. Here, the semiconductor memory device may be comprised of three or more memory banks 311 and 312.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
   first and second memory arrays having first and second pairs of differential input/output lines electrically coupled thereto, respectively;
   a sense amplifier having first and second pairs of differential input/output lines;
   a first equalization device electrically coupled to the first pair of differential input/output lines of said first memory array;
   a second equalization device electrically coupled to the second pair of differential input/output lines of said second memory array;
   a first isolation gate electrically coupled between said first equalization device and the first pair of differential input/output lines of said sense amplifier;
   a second isolation gate electrically coupled between said second equalization device and the second pair of differential input/output lines of said sense amplifier;
   a first equalization controller electrically coupled to said first equalization device;
   a second equalization controller electrically coupled to said second equalization device;
   a first isolation gate controller having a first and second inputs electrically coupled to said second equalization controller and a control signal line, respectively; and
   a second isolation gate controller having a first and second inputs electrically coupled to said first equalization controller and the control signal line, respectively.

2. The memory device of claim 1, wherein said first equalization device and said first equalization controller comprise a first pass transistor and a first pull-up/down transistor, respectively, which are responsive to a first pair of equalization signal lines; and wherein said second equalization device and said second equalization controller comprise a second pass transistor and a second pull-up/down transistor, respectively, which are responsive to a second pair of equalization signal lines.

3. The memory device of claim 2, wherein said first isolation gate and said first isolation gate controller comprise a first pair of pass transistors and a first pull-up/down transistor pair, respectively; and wherein said second isolation gate and said second isolation gate controller comprise a second pair of pass transistors and a second pull-up/down transistor pair, respectively.

4. The memory device of claim 3, wherein said first pull-up/down transistor pair has first and second gate electrodes electrically coupled to one of the second pair of equalization signal lines and the control signal line; and wherein said second pull-up/down transistor pair has first and second gate electrodes electrically coupled to one of the first pair of equalization signal lines and the control signal line.

5. The memory device of claim 4, wherein the first pair of equalization signal lines comprise a first pair of differential equalization signal lines; and wherein the second pair of equalization signal lines comprise a second pair of differential equalization signal lines.

6. The memory device of claim 5, wherein the first pass transistor has source and drain regions which are electrically connected to the first pair of differential input/output lines; and wherein the first pull-up/down transistor has a drain region electrically coupled to another of the first pair of equalization signal lines and a source region electrically coupled to a power supply signal line or a ground signal line.

7. The memory device of claim 6, wherein the first pass transistor and the first pull-up/down transistor are selected from the group consisting of NMOS and PMOS transistors.

8. The memory device of claim 7, wherein the first isolation gate is electrically coupled to a first isolation signal line; and wherein the first pull-up/down transistor pair comprises a pair of MOS transistors electrically coupled in series between the first isolation signal line and a power supply signal line or a ground signal line.

9. The memory device of claim 8, wherein the second isolation gate is electrically coupled to a second isolation signal line; and wherein the second pull-up/down transistor pair comprises a pair of MOS transistors electrically coupled in series between the second isolation signal line and a power supply signal line or a ground signal line.

10. The memory device of claim 1, wherein said first isolation gate and said first isolation gate controller comprise a first pair of pass transistors and a first pull-up/down transistor pair, respectively; and wherein said second isolation gate and said second isolation gate controller comprise a second pair of pass transistors and a second pull-up/down transistor pair, respectively.

11. The memory device of claim 2, wherein the first pass transistor has source and drain regions which are electrically connected to the first pair of differential input/output lines; and wherein the first pull-up/down transistor has a drain region electrically coupled to another of the first pair of equalization signal lines and a source region electrically coupled to a power supply signal line or a ground signal line.

12. The memory device of claim 3, wherein the first isolation gate is electrically coupled to a first isolation signal line; and wherein the first pull-up/down transistor pair comprises a pair of MOS transistors electrically coupled in series between the first isolation signal line and a power supply signal line or a ground signal line.

13. The memory device of claim 3, wherein the second isolation gate is electrically coupled to a second isolation signal line; and wherein the second pull-up/down transistor pair comprises a pair of MOS transistors electrically coupled in series between the second isolation signal line and a power supply signal line or a ground signal line.

14. An integrated circuit memory device, comprising:
   first and second memory arrays having first and second pairs of differential input/output lines electrically coupled thereto, respectively;
   a sense amplifier having first and second pairs of differential input/output lines; and
   means, coupled to a control signal line, for forming a first electrical connection between the first pairs of differential input/output lines of said first memory array and said sense amplifier while simultaneously forming a second electrical connection between the second pairs of differential input/output lines of said second memory array and said sense amplifier when the control signal line is in a first logic state, and preventing simultaneous formation of the first and second electrical connections when the control signal line is in a second logic state.

* * * * *